US008581632B2

(12) United States Patent
Hsiao

(10) Patent No.: US 8,581,632 B2
(45) Date of Patent: Nov. 12, 2013

(54) COMPARATOR WITH TRANSITION THRESHOLD TRACKING CAPABILITY

(75) Inventor: Keng-Jan Hsiao, Taoyuan (TW)

(73) Assignee: Mediatek Inc., Hsin-Chu (TW)

(*) Notice: Subject to any disclaimer, the term of this patent is extended or adjusted under 35 U.S.C. 154(b) by 0 days.

(21) Appl. No.: 13/612,799

(22) Filed: Sep. 12, 2012

(65) Prior Publication Data

US 2013/0200924 A1    Aug. 8, 2013

Related U.S. Application Data

(60) Provisional application No. 61/596,353, filed on Feb. 8, 2012.

(51) Int. Cl.
*G11C 7/00*    (2006.01)

(52) U.S. Cl.
USPC .................................. 327/54; 327/65; 327/67

(58) Field of Classification Search
USPC ........... 327/54, 51, 52, 63, 65, 67, 68, 72, 73, 327/335, 363, 560, 561, 563
See application file for complete search history.

(56) References Cited

U.S. PATENT DOCUMENTS

| 5,122,680 | A | * | 6/1992 | Stakely et al. | 327/73 |
| 5,872,468 | A | * | 2/1999 | Dyke | 327/72 |
| 2009/0027086 | A1 | * | 1/2009 | Trifonov | 327/66 |
| 2011/0227608 | A1 | * | 9/2011 | Floyd | 327/63 |

OTHER PUBLICATIONS

Boas, A.V., et al.; "A Temperature Compensated Digitally Trimmable On-Chip IC Oscilaltor with Low Voltage Inhibiy Capability;" IEEE; 2004; pp. 501-504.
Choe, K., et al.; "A Precision Relaxation Oscillator with a Self-Clocked Offest-Cancellation Scheme for Implantable Biomedical SoCs;" International Solid-State Circuits Conference; Session 23; 2009; pp. 402-404.
Denier, U.; "Analysis and Design of an Ultralow-Power CMOS Relaxation Oscillator;" IEEE Transactions on Circuits and Systems—I: Regular Papers; vol. 57; No. 8; Aug. 2010; pp. 1973-1982.
Tokunaga, Y., et al.; "An On-Chip CMOS Relaxation Oscillator with Voltage Averaging Feedback;" IEEE Journal of Solid-State Circuits; vol. 45; No. 6; Jun. 2010; pp. 1150-1158.
Lee, J., et al.; "A 10MHz 80uW 67 ppm/C CMOS Reference Clock Oscillator with a Temperature Compensated Feedback Loop in 0.18um CMOS;" Symposium on VLSI Circuits Digest of Technical Papers; 2009; pp. 226-227.

* cited by examiner

*Primary Examiner* — Lincoln Donovan
*Assistant Examiner* — Jung H Kim
(74) *Attorney, Agent, or Firm* — McClure, Qualey & Rodack, LLP

(57) ABSTRACT

A comparator is provided. The comparator includes a voltage generator, a buffer unit and a threshold control loop. The voltage generator has an output terminal for providing a reference voltage according to a constant current. The buffer unit provides an output signal according to a first input signal and a bias signal. The threshold control loop provides the bias signal to the buffer unit according to a second input signal, so as to regulate a transition threshold of the buffer unit to close to the second input signal. The output signal represents a compare result of the first and second input signals. The buffer unit and the threshold control loop are powered by the reference voltage.

12 Claims, 8 Drawing Sheets

US 8,581,632 B2

COMPARATOR WITH TRANSITION THRESHOLD TRACKING CAPABILITY

CROSS REFERENCE TO RELATED APPLICATIONS

This application claims priority of U.S. Provisional Application No. 61/596,353, filed on Feb. 8, 2012, the entirety of which is incorporated by reference herein.

BACKGROUND OF THE INVENTION

1. Field of the Invention

The invention relates to a comparator, and more particularly to a comparator with transition threshold tracking capability.

2. Description of the Related Art

On-chip oscillators are in high demand as an external crystal replacement by low-cost and single-chip systems. The frequency stability of an oscillator against variations in temperature and supply voltage is a critical specification for an on-chip oscillator. Working with wide range of supply voltages is also preferred, to gain the most operating time when powered by a battery.

In general, a wide supply range oscillator with typical frequency stability can better accommodate temperature changes. Furthermore, relaxation oscillators with voltage averaging feedback (VAF) or an offset cancellation technique have good temperature stability, wherein the relaxation oscillators only work with a limited supply range. Moreover, an oscillator with a frequency tracking loop provides a stable output clock under wide supply voltage and temperature variations, but it requires a bandgap circuit with high precision, which increases the cost.

Therefore, a relaxation oscillator with adaptive supply voltage generation is desired to achieve the best frequency stability and fixed output frequency under a wide supply variation. To accomplish the adaptive supply voltage generation, the present invention proposes a comparator circuit with threshold tracking technique.

BRIEF SUMMARY OF THE INVENTION

Comparators are provided. An embodiment of a comparator is provided. The comparator comprises: a voltage generator, having an output terminal for providing a reference voltage according to a constant current; a buffer unit, providing an output signal according to a first input signal and a bias signal; and a threshold control loop, providing the bias signal to the buffer unit according to a second input signal, so as to regulate a transition threshold of the buffer unit to close to the second input signal. The output signal represents a compare result of the first and second input signals. The buffer unit and the threshold control loop are powered by the reference voltage.

Furthermore, another embodiment of a comparator is provided. The comparator comprises: a buffer unit, providing an output signal according to a first input signal and a bias signal; and a threshold control loop, providing the bias signal to the buffer unit according to a second input signal, so as to regulate a transition threshold of the buffer unit to close to the second input signal. The threshold control loop comprises: a first PMOS transistor coupled to a first node, having a gate for receiving the second input signal; a first NMOS transistor coupled to a ground, having a gate coupled to the first node; and a second NMOS transistor coupled between the first node and the first NMOS transistor, having a gate for receiving the second input signal, wherein the bias signal is a signal of the first node. The output signal represents a compare result of the first and second input signals.

Moreover, another embodiment of a comparator for comparing a first input signal and a second input signal to obtain an output signal is provided. The comparator comprises: a voltage generator, having an output terminal for providing a reference voltage according to a constant current and the second input signal; a buffer unit, providing the output signal according to the first input signal and a bias signal; and a threshold control loop, providing the bias signal to the buffer unit according to the second input signal, so as to regulate a transition threshold of the buffer unit to close to the second input signal. The buffer unit and the threshold control loop are powered by the reference voltage.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
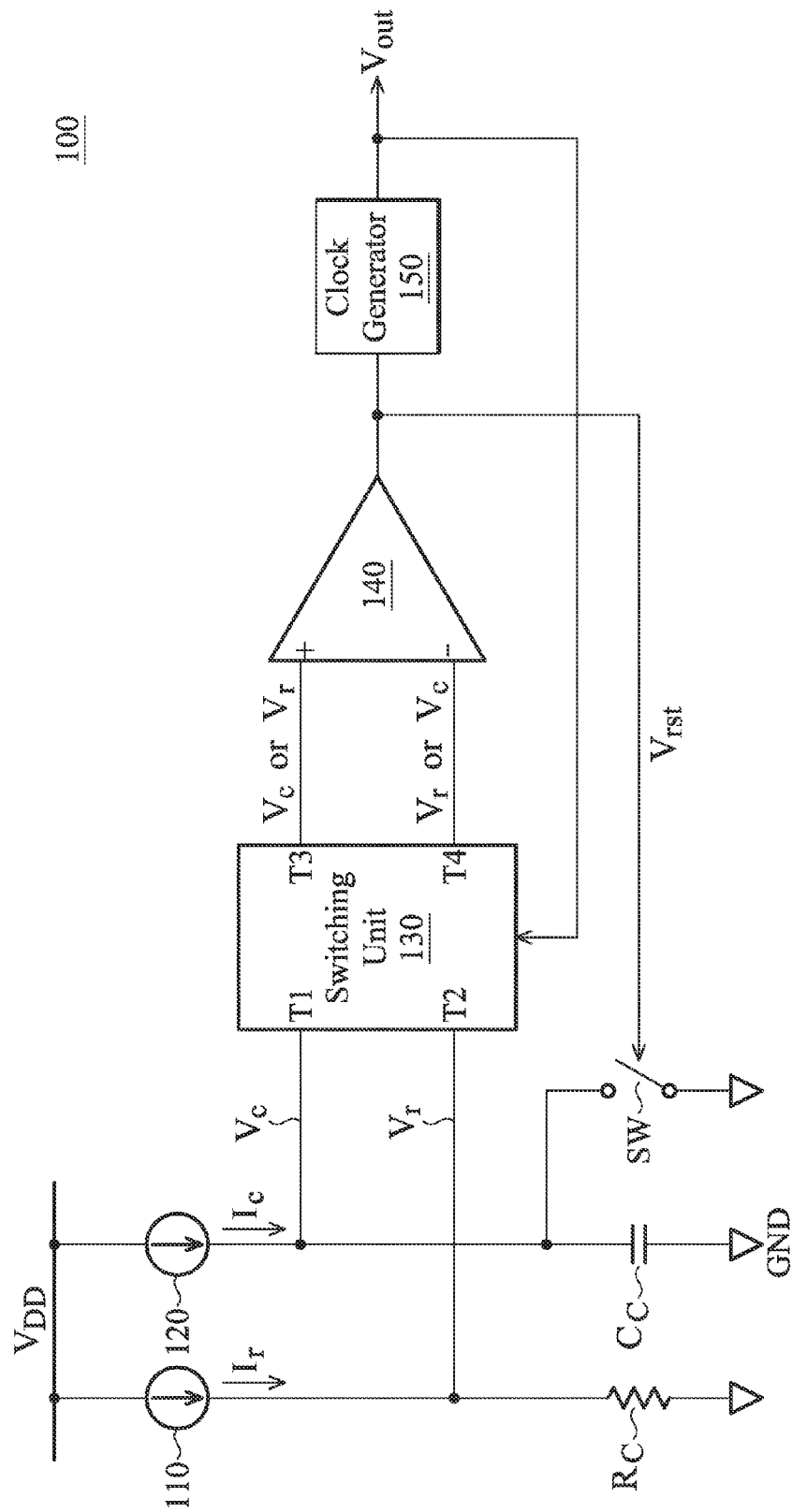
FIG. 1 shows a relaxation oscillator according to an embodiment of the invention.

FIG. 1 shows a relaxation oscillator 100 according to an embodiment of the invention. The relaxation oscillator 100 comprises the current sources 110 and 120, a switching unit 130, a comparator 140, a clock generator 150, a resistive element (e.g., resistor $R_C$), a capacitive element (e.g., capacitor $C_C$) and a switch SW. The resistor $R_C$ is coupled between the current source 110 and a ground GND, and the capacitor $C_C$ is coupled between the current source 120 and the ground GND. The current source 110 coupled to a supply voltage $V_{DD}$ is used to provide a current $I_r$ to the resistor $R_C$, so as to generate a voltage $V_r$ to a terminal T2 of the switching unit 130. The current source 120 coupled to the supply voltage $V_{DD}$ is used to provide a current $I_c$ to the capacitor $C_C$, so as to generate a voltage $V_c$ to a terminal T1 of the switching unit 130. The non-inverting and inverting input terminals of the comparator 140 are coupled to the terminals T3 and T4 of the switching unit 130, respectively. According to an output clock $V_{out}$ from the clock generator 150, the switching unit 130 alternately provides the voltage $V_c$ or $V_r$ to the non-inverting input terminal of the comparator 140 via the terminal T3 thereof, and also alternately provides the voltage $V_r$ or $V_c$ to the inverting input terminal of the comparator 140 via the terminal T4 thereof. For example, the switching unit 130 respectively provides the voltages $V_c$ and $V_r$ to the non-inverting and inverting input terminals of the comparator 140 when the output clock $V_{out}$ is at a first voltage level (e.g. a HIGH level), and the switching unit 130 respectively provides the voltages $V_r$ and $V_c$ to the non-inverting and inverting input terminals of the comparator 140 when the output clock $V_{out}$ is at a second voltage level (e.g. a LOW level). The comparator 140 compares the voltages $V_r$ and $V_c$ to obtain a reset pulse $V_{rst}$, and provides the reset pulse $V_{rst}$ to the clock generator 150 and the switch SW. The switch SW is coupled to the capacitor $C_C$ in parallel, which is used to discharge the capacitor $C_C$ according to the reset pulse $V_{rst}$. The clock generator 150 generates the output clock $V_{out}$ according to the reset pulse $V_{rst}$. In one example, the clock generator 150 flips the clock signal Vout when the compare result (the reset pulse $V_{rst}$) indicates that the cross voltage Vc of the capacitive element Cc substantially reaches the cross voltage Vr of the resistive element Rc. Therefore, the capacitor $C_C$ is discharged when the clock signal is flipped (e.g., transits from high level to low level and from low level to high level) or when the compare result indicates that the voltage Vc substantially reaches the voltage Vr. In FIG. 1, by interchanging the input signals of the non-inverting and inverting input terminals of the comparator 140, an offset voltage caused by the device mismatches existing in the comparator 140 is eliminated. Thus, clock frequency of the output clock $V_{out}$ is stable.

Figure 2:
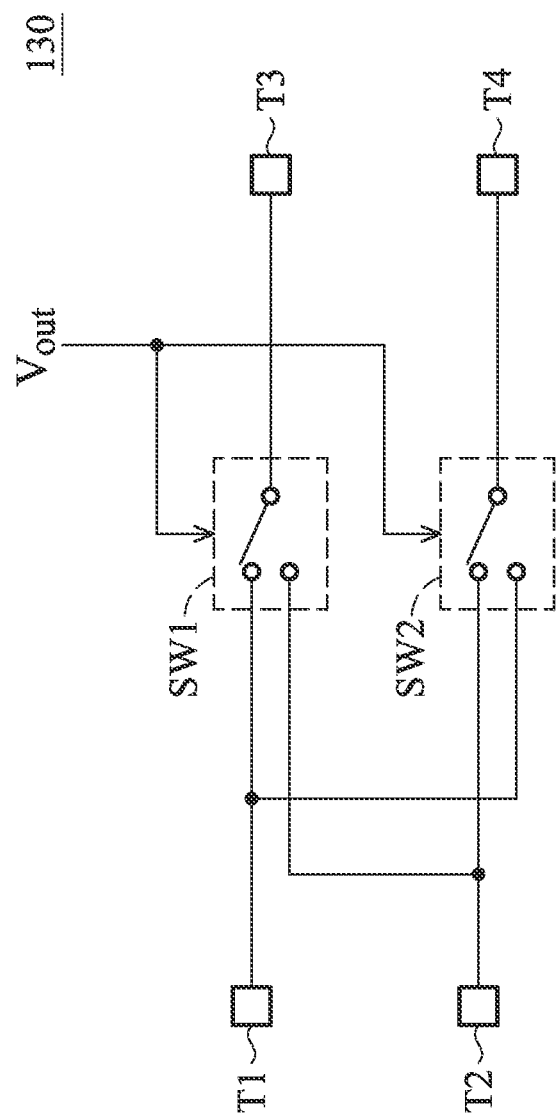
FIG. 2 shows the switching unit of FIG. 1 according to an embodiment of the invention.

FIG. 2 shows the switching unit 130 of FIG. 1 according to an embodiment of the invention. The switching unit 130 comprises two switches SW1 and SW2. According to the output clock $V_{out}$, the switch SW1 selectively couples the terminal T3 to the terminal T1 or T2, and the switch SW2 selectively couples the terminal T4 to the terminal T1 or T2. For example, the terminals T3 and T4 are respectively coupled to the terminals T1 and T2 when the output clock $V_{out}$ is at a first voltage level, and the terminals T3 and T4 are respectively coupled to the terminals T2 and T1 when the output clock $V_{out}$ is at a second voltage level.

Figure 3:
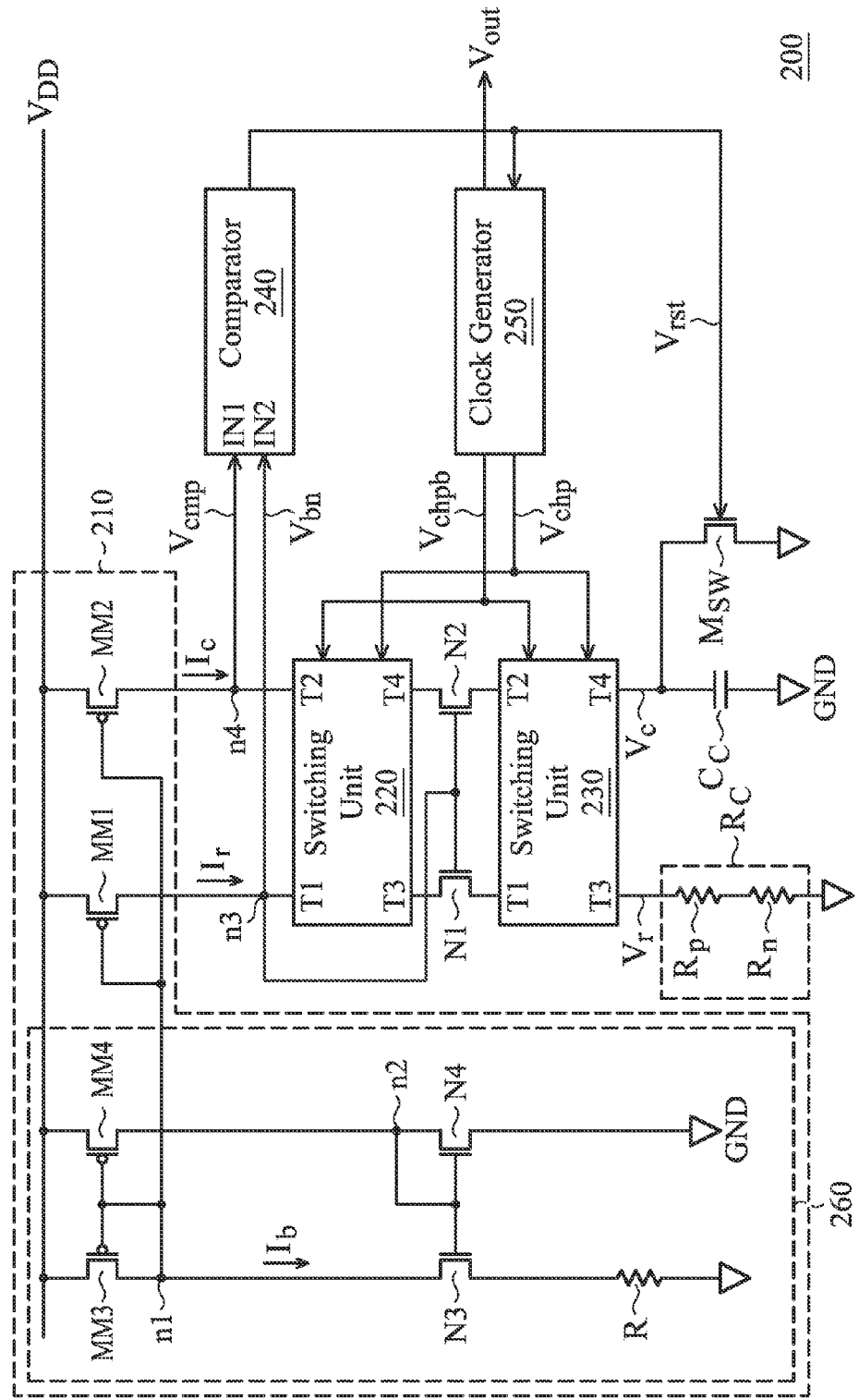
FIG. 3 shows a relaxation oscillator according to another embodiment of the invention.

FIG. 3 shows a relaxation oscillator 200 according to another embodiment of the invention. The relaxation oscillator 200 comprises a current mirror 210, the switching units 220 and 230, the NMOS transistors N1 and N2, a resistor $R_C$, a capacitor CC and a NMOS transistor $M_{SW}$, a comparator 240 and a clock generator 250. In the embodiment, the NMOS transistor $M_{SW}$ functions as a switch. The current mirror 210 comprises a bias circuit 260 and the mirror transistors MM1 and MM2. The mirror transistor MM1 is coupled between the supply voltage $V_{DD}$ and a node n3, and the mirror transistor MM2 is coupled between the supply voltage $V_{DD}$ and a node n4. The bias circuit 260 can be a constant-gm bias circuit for generating a bias current $I_b$. The bias circuit 260 comprises the mirror transistors MM3 and MM4, the NMOS transistors N3 and N4 and a resistor R. The mirror transistor MM3 is coupled between the supply voltage $V_{DD}$ and a node n1, which has a gate coupled to the node n1. The mirror transistor MM4 is coupled between the supply voltage $V_{DD}$ and a node n2, which has a gate coupled to the node n1. The NMOS transistor N3 is coupled between the node n1 and the resistor R, which has a gate coupled to the node n2. The NMOS transistor N4 is coupled between the node n2 and the ground GND, which has a gate coupled to the node n2. The resistor R is coupled between the NMOS transistor N3 and the ground GND. In response to the bias current $I_b$, the mirror transistor MM1 provides a current $I_r$ to the node n3, and the mirror transistor MM2 provides a current $I_c$ to the node n4. The terminals T1 and T2 of the switching unit 220 are coupled to the mirror transistors MM1 and MM2, respectively, and the terminals T3 and T4 of the switching unit 220 are coupled to the NMOS transistors N1 and N2, respectively. According to the chopper clocks $V_{chp}$ and $V_{chpb}$ from the clock generator 250, the switching unit 220 alternately couples the NMOS transistors N1 and N2 to the nodes n3 and n4. Furthermore, the terminals T1 and T2 of the switching unit 230 are coupled to the NMOS transistors N1 and N2, respectively, and the terminals T3 and T4 of the switching unit 230 are coupled to the resistor $R_C$ and capacitor $C_C$, respectively. According to the chopper clocks $V_{chp}$ and $V_{chpb}$ from the clock generator 250, the switching unit 230 alternately couples the NMOS transistors N1 and N2 to the resistor $R_C$ and capacitor $C_C$. The resistor $R_C$ comprises the resistors $R_p$ and $R_n$ connected in series. The comparator 240 has a second input terminal IN2 coupled to the node n3 and a first input terminal IN1 coupled to the node n4. The comparator 240 compares a voltage $V_{bn}$ at the node n3 and a voltage $V_{cmp}$ at the node n4 to obtain a reset pulse $V_{rst}$. However, this is for illustrative purpose and not meant to be a limitation. For example, the comparator 240 may compare the voltage Vr of the first resistor Rc and the voltage Vc of the capacitor Cc to obtain the compare result. The NMOS transistor $M_{SW}$ is coupled to the capacitor $C_C$ in parallel, which is used to discharge the capacitor $C_C$ according to the reset pulse $V_{rst}$. The clock generator 150 generates an output clock $V_{out}$ and the chopper clocks $V_{chp}$ and $V_{chpb}$ according to the reset pulse $V_{rst}$. In this way, by switching the differential inputs of the comparator 240 every half cycle of the output clock Vout, the frequency drift induced by comparator offset can be reduced.

In FIG. 3, a current-mode comparator formed by the NMOS transistors N1 and N2, performs a voltage comparison between the voltages $V_r$ and $V_c$, wherein the voltage $V_c$ is a voltage across the capacitor $C_c$. In one embodiment, the capacitor $C_c$ is a metal-over-metal (MoM) capacitor. The current mode comparator is ideal for power saving by the reusing of current and the oscillation frequency could be derived as per the following equation (1):

$$\Delta T = \frac{I_r \cdot R_c \cdot C_c}{I_c} + \tau, \quad (2)$$

where $R_c$ is a reference generating resistor, $I_c$ is the charging current of the capacitor $C_c$, $I_r$ is the biasing current of the resistor $R_c$ and $\tau$ represents the delay induced by the current mode comparator and the comparator 240, wherein $\tau$ is much smaller than the oscillation period of the relaxation oscillator 200 and can be ignored. As a result, temperature stability is dominant by the variation of the resistor $R_C$, because the ratio between the currents $I_r$ and $I_c$ is temperature-independent and the temperature variation of the capacitor $C_c$ is also negligible. However, if the device mismatch of the NMOS transistors N1 and N2 is taken into account, the equation (1) is re-written as the following equation (2):

$$\Delta T = \frac{I_r \cdot R_c \cdot C_c}{I_c} + \frac{V_{os} \cdot C_c}{I_c} + \tau, \quad (2)$$

where $V_{os}$ represents the input-referred offset voltage of the NMOS transistors N1 and N2. It is obvious that $I_c$ greatly affects the temperature stability of the relaxation oscillator 200. A self-chopped technique is used to solve this problem without the adoption of temperature-independent current references. The NMOS transistors N1 and N2 cancel the frequency drift caused by the offset voltage $V_{os}$ every half cycle of the chopper clocks $V_{chp}$ and $V_{chpb}$. To further improve the temperature stability, the resistor $R_c$ comprises the p-poly resistor $R_p$ and the n-poly resistor $R_n$ coupled in series, wherein the p-poly resistor $R_p$ and the n-poly resistor $R_n$ have opposite temperature coefficients, thereby reducing the temperature variation of the resistor $R_c$.

Figure 4:
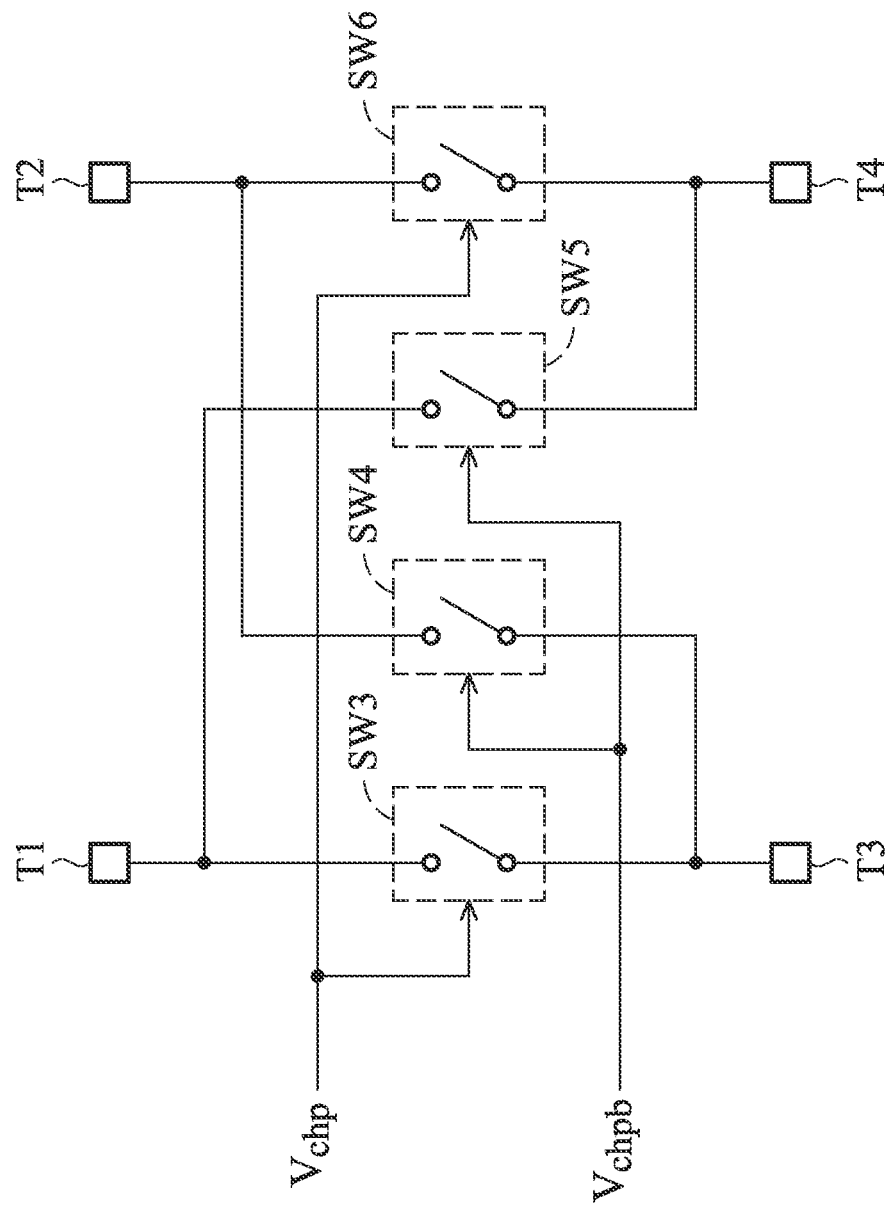
FIG. 4 shows a schematic illustrating the switching units of FIG. 3.

FIG. 4 shows a schematic illustrating the switching units 220 and 230 of FIG. 3. In FIG. 4, a switch SW3 is coupled between the terminals T1 and T3, a switch SW4 is coupled between the terminals T2 and T3, a switch SW5 is coupled between the terminals T1 and T4, and a switch SW6 is coupled between the terminals T2 and T4. The switches SW3 and SW6 are controlled by the clock signal $V_{chp}$, and the switches SW4 and SW5 are controlled by the clock signal $V_{chpb}$. In one embodiment, each of the switches SW3, SW4, SW5 and SW6 is a transmission gate. Furthermore, the chopper clocks $V_{chp}$ and $V_{chpb}$ may be complementary or non-overlapped.

Figure 5:
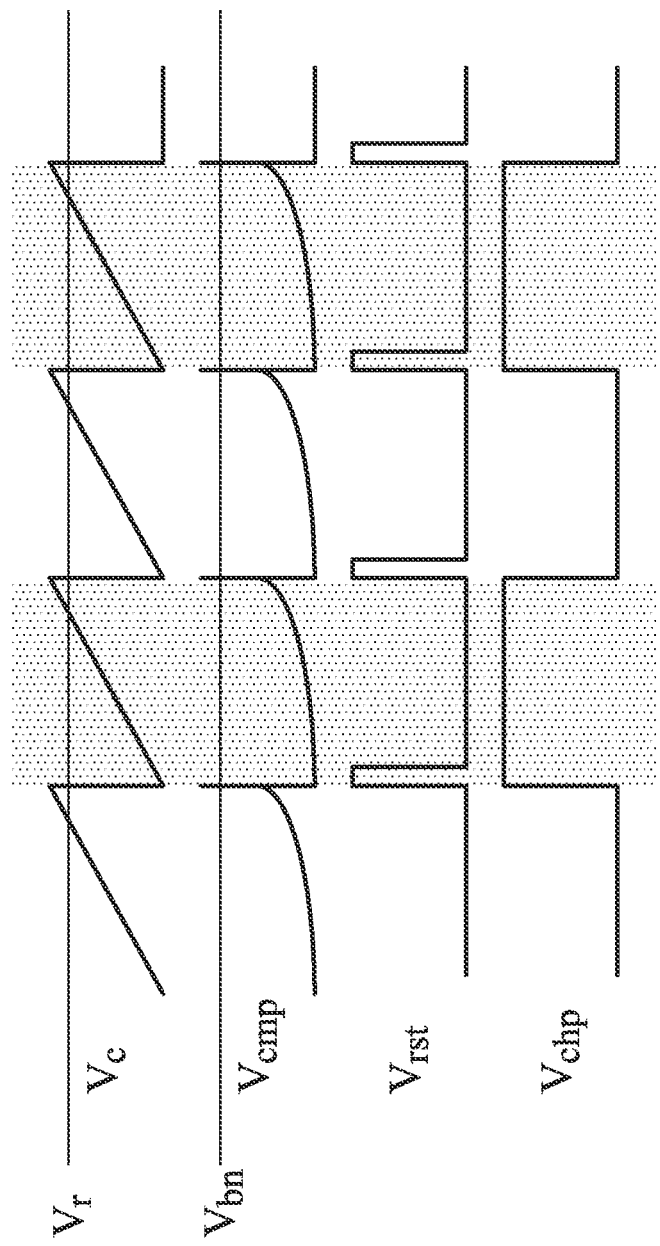
FIG. 5 shows an example illustrating a timing diagram of the relaxation oscillator of FIG. 3.

FIG. 5 shows an example illustrating a timing diagram of the relaxation oscillator 200 of FIG. 3. Referring to FIG. 3, FIG. 4 and FIG. 5 together, for the initial phase, the chopper clock $V_{chp}$ is at a low voltage level, and the NMOS transistors N1 and N2 are respectively connected to the resistor $R_c$ and the capacitor $C_c$ via the switching unit 230. Next, the capacitor $C_c$ is charged, and the voltage $V_c$ rises. When the voltage $V_c$ substantially reaches the voltage $V_r$, the voltage $V_{cmp}$ goes high which substantially reaches the voltage Vbn and the reset pulse $V_{rst}$ is triggered by the comparator 240. Furthermore, the reset pulse $V_{rst}$ is also used for the generation of dual-phase and non-overlapped chopper clocks $V_{chp}$ and $V_{chpb}$. In the clock generator 250, the toggle of the reset pulse $V_{rst}$ flips the chopper clocks $V_{chp}$ and $V_{chpb}$, which interchanges the drain/source connections of the NMOS transistors N1 and N2, and another charging cycle starts. After the capacitor $C_c$ is charged to the voltage $V_r$ again, the whole chopping cycle completes.

Figure 6:
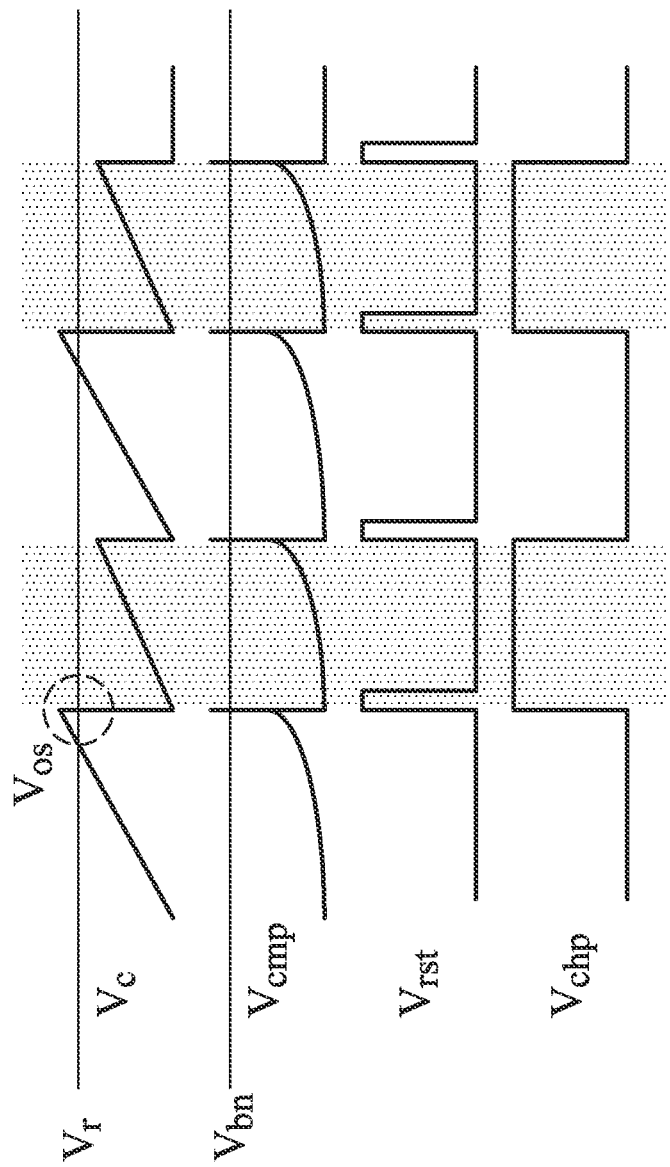
FIG. 6 shows an example illustrating a significant mismatch existing between the NMOS transistors N1 and N2 of FIG. 3.

FIG. 6 shows an example illustrating a significant mismatch existing between the NMOS transistors N1 and N2 of FIG. 3. The timing error caused by the offset voltage $V_{os}$ is eliminated. The offset voltage $V_{os}$ only degrades the 50% duty cycle of the chopper clocks $V_{chp}$ and $V_{chpb}$, which is less important than the stability of clock frequency. It is noted that the chopper clock $V_{chp}$ is also the output clock $V_{out}$ of the relaxation oscillator 200.

In the relaxation oscillator 200 of FIG. 3, a transition threshold of $V_{cmp}$ is important, which decides the discharging instance of the capacitor $C_c$ and also the period of the output clock $V_{out}$. To generate a stable clock, an adaptive supply generation with threshold tracking technique is used in the comparator 240.

Figure 7:
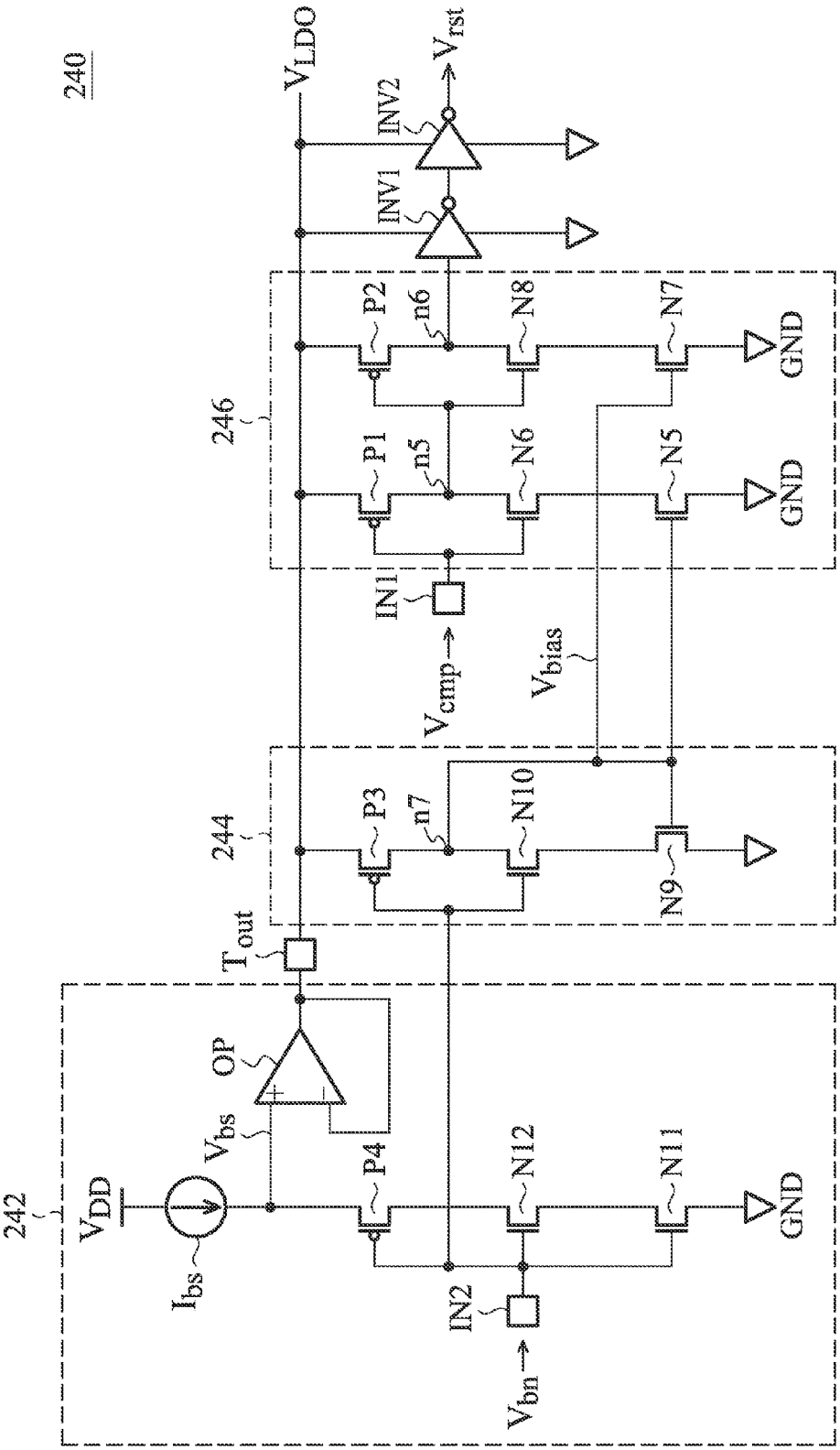
FIG. 7 shows the comparator of FIG. 3 according to an embodiment of the invention.

FIG. 7 shows the comparator 240 of FIG. 3 according to an embodiment of the invention. The comparator 240 comprises a voltage generator 242, a threshold control loop 244 and a buffer unit 246 and the inverters INV1 and INV2. The voltage generator 242 comprises a current source $I_{bs}$, a PMOS transistor P4, the NMOS transistors N11 and N12 and an amplifier OP. The voltage generator 242 provides a low dropout reference voltage $V_{LDO}$ at an output terminal $T_{out}$. The current source $I_{bs}$ coupled to the supply voltage $V_{DD}$ is used to provide a constant current to the PMOS transistor P4. The PMOS transistor P4 is coupled between the current source $I_{bs}$ and the NMOS transistor N12, and has a gate coupled to the second input terminal IN2 for receiving the voltage $V_{bn}$. The NMOS transistor N12 is coupled between the PMOS transistor P4 and the NMOS transistor N11, and has a gate coupled to the second input terminal IN2. The NMOS transistor N11 is coupled between the NMOS transistor N12 and the ground GND, and has a gate coupled to the second input terminal IN2. The PMOS transistor P4 and NMOS transistors N12 and N11 together form an inverter biased with the constant current Ibs and the voltage $V_{bn}$ (e.g., the voltage of the second output terminal of the current mirror 210). The amplifier OP has a non-inverting terminal coupled to the current source $I_{bs}$ and the PMOS transistor P4, an inverting terminal coupled to the output terminal $T_{out}$, and an output terminal coupled to the output terminal $T_{out}$. The threshold control loop 244 comprises a PMOS transistor P3 and the NMOS transistors N9 and N10. The PMOS transistor P3 is coupled between the output terminal $T_{out}$ and a node n7, and has a gate coupled to the second input terminal IN2. The NMOS transistor N10 is coupled between the node n7 and the NMOS transistor N9, and has a gate coupled to the second input terminal IN2. The NMOS transistor N9 is coupled between the NMOS transistor N10 and the ground GND, which has a gate coupled to the node n7. The threshold control loop 244 is powered by the low dropout reference voltage $V_{LDO}$ and is used to provide a bias signal $V_{bias}$ to the buffer unit 246 according to the input signal $V_{bn}$ received at the second input terminal IN2 (e.g., the second output terminal of the current mirror 210), so as to regulate a transition threshold of the buffer unit 246 to close to the voltage $V_{bn}$. The clock buffer 246 comprises the PMOS transistors P1 and P2 and the NMOS transistors N5-N8. The PMOS transistor P1 is coupled between the output terminal $T_{out}$ and a node n5, and has a gate coupled to the first input terminal IN1 for receiving the voltage $V_{cmp}$. The NMOS transistor N6 is coupled between the node n5 and the NMOS transistor N5, and has a gate coupled to the first input terminal IN1. The NMOS transistor N5 is coupled between the NMOS transistor N6 and the ground GND, and has a gate coupled to the node n7 of the threshold control loop 244 for receiving the bias signal $V_{bias}$. The PMOS transistor P2 is coupled between the output terminal $T_{out}$ and a node n6, and has a gate coupled to the node n5. The NMOS transistor N8 is coupled between the node n6 and the NMOS transistor N7, and has a gate coupled to the node n5. The NMOS transistor N7 is coupled between the NMOS transistor N8 and the ground GND, and has a gate coupled to the node n7. The buffer unit 246 provides an output signal according to the input signal Vcmp received at the first input terminal IN1 (e.g., the first output terminal of the current mirror 210) and the bias signal Vbias, wherein the output signal represents a compare result of Vbn and Vcmp. The inverter INV1 is coupled between the node n6 and the inverter INV2. The inverter INV2 is coupled to an output terminal of the inverter INV1, which is used to output the reset pulse $V_{rst}$. Specifically, the threshold control loop 244, clock buffer 246 and the inverters INV1 and INV2 are powered by the reference voltage $V_{LDO}$.

In the voltage generator 242, a reference voltage $V_{bs}$ is generated by biasing a dummy inverter formed by the PMOS transistor P4 and the NMOS transistors N11 and N12, with the constant current provided by the current source $I_{bs}$. It is to be noted that the gate of the dummy inverter is biased with the voltage $V_{bn}$ rather than an output of the dummy inverter. By proper sizing, a transition threshold of the dummy inverter is set, to close to the voltage $V_{bn}$, which indicates that if an inverter with the same size PMOS transistor P4 and NMOS transistors N11 and N12 is biased with the voltage $V_{bn}$, the transition threshold would be in the vicinity of the voltage $V_{bn}$. To eliminate the systematic and random offset induced by the voltage generator 242, the threshold control loop 244 is utilized to regulate the transition threshold of the buffer unit 246.

Figure 8:
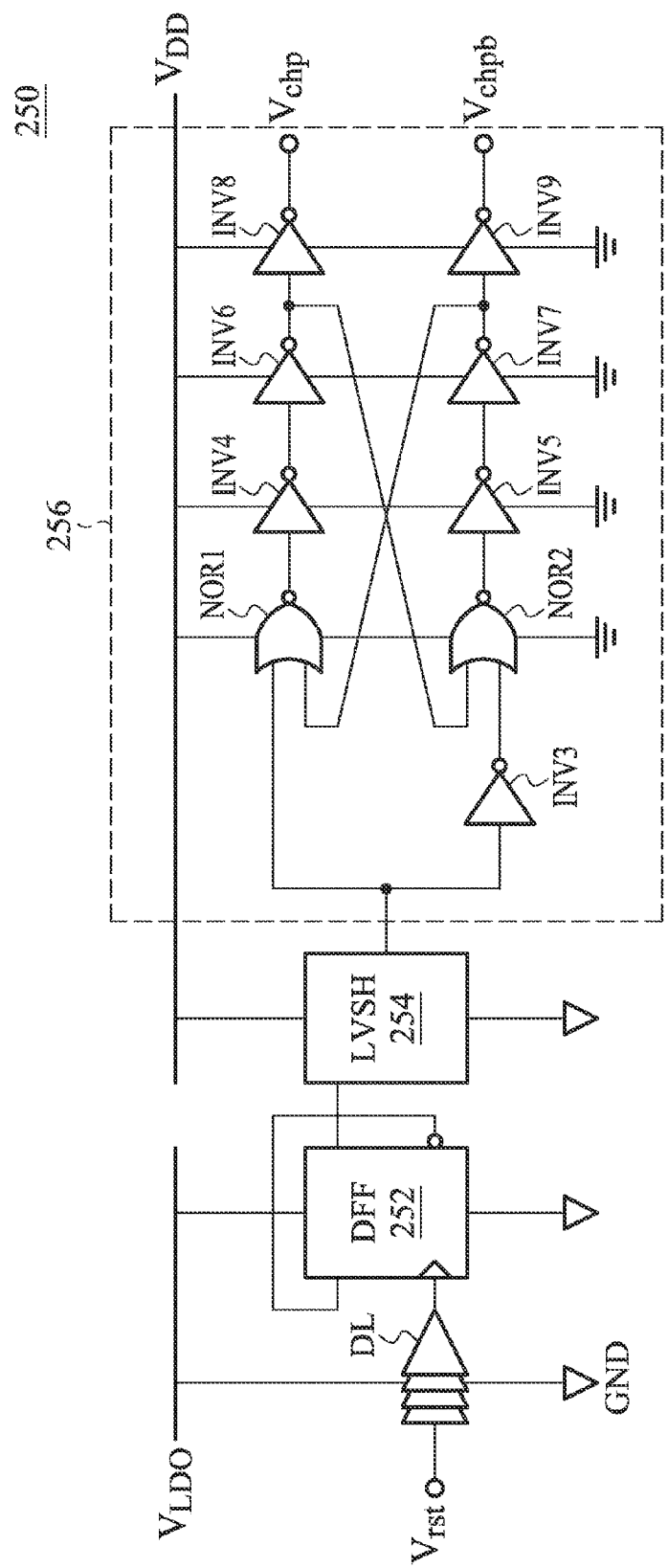
FIG. 8 shows the clock generator of FIG. 3 according to an embodiment of the invention.

FIG. 8 shows the clock generator 250 of FIG. 3 according to an embodiment of the invention. The clock generator 250 comprises a plurality of delay cells DL, a D flip-flop 252, a low-to-high level shifter 254 and a non-overlapped clock generator 256, wherein the non-overlapped clock generator 256 comprises the NOR logic gates NOR1 and NOR2 and the inverters INV3-INV9. First, the reset pulse $V_{rst}$ is delayed by the delay cells DL, and then the delayed reset pulse $V_{rst}$ toggles the D flip-flop 252. A divided-by-2 clock is converted to the supply voltage $V_{DD}$ by the low-to-high level shifter 254. Next, the level-shifted clock is processed by the non-overlapped clock generator 256, and then the chopper clocks $V_{chp}$ and $V_{chpb}$ are produced. Therefore, by using the chopper clocks $V_{chp}$ and $V_{chpb}$ to control the switching units 220 and 230, the relaxation oscillator 200 of FIG. 3 with adaptive supply generation provides the stable output clock $V_{out}$ to accommodate variations in temperature and supply voltages.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A comparator, comprising:
   a voltage generator, having an output terminal for providing a reference voltage according to a constant current;
   a buffer unit, providing an output signal according to a first input signal and a bias signal; and
   a threshold control loop, providing the bias signal to the buffer unit according to a second input signal, so as to regulate a transition threshold of the buffer unit close to the second input signal,
   wherein the output signal represents a compare result of the first and second input signals,
   wherein the buffer unit and the threshold control loop are powered by the reference voltage.

2. The comparator as claimed in claim 1, wherein the buffer unit comprises:
   a first PMOS transistor coupled between the output terminal of the voltage generator and a first node, having a gate for receiving the first input signal;
   a first NMOS transistor coupled to a ground, having a gate for receiving the Bias signal;
   a second NMOS transistor coupled between the first NMOS transistor and the first node, having a gate for receiving the first input signal;
   a second PMOS transistor coupled between the output terminal of the voltage generator and a second node, having a gate coupled to the first node;
   a third NMOS transistor coupled to the ground, having a gate for receiving the bias signal; and
   a fourth NMOS transistor coupled between the third NMOS transistor and the second node, having a gate for receiving the first input signal,
   wherein a voltage of the second node represents the compare result of the first and second input signals.

3. The comparator as claimed in claim 2, further comprising:
   a first inverter coupled to the second node of the buffer unit; and
   a second inverter coupled to the first inverter, outputting the output signal,
   wherein the first and second inverters are powered by the reference voltage.

4. The comparator as claimed in claim 1, wherein the threshold control loop comprises:
   a third PMOS transistor coupled between the output terminal of the voltage generator and a third node, having a gate for receiving the second input signal;
   a fifth NMOS transistor coupled to a ground, having a gate coupled to the third node; and
   a sixth NMOS transistor coupled between the third node and the fifth NMOS transistor, having a gate for receiving the second input signal,
   wherein the bias signal is a signal of the third node.

5. The comparator as claimed in claim 1, wherein the voltage generator comprises:
   a current source, providing the constant current; and
   an inverter coupled to the current source, having a terminal receiving the second input signal;
   where the inverter is biased with the constant current to generate the reference voltage.

6. The comparator as claimed in claim 1, wherein the voltage generator comprises:
   a current source, providing the constant current;
   a fourth PMOS transistor coupled to the current source, having a gate for receiving the second input signal;
   a seventh NMOS transistor coupled to a ground, having a gate for receiving the second input signal;
   an eighth NMOS transistor coupled between the fourth PMOS transistor and the seventh NMOS transistor, having a gate for receiving the second input signal; and
   an amplifier, having a non-inverting input terminal coupled to the current source and the fourth PMOS transistor, an inverting input terminal and an output terminal coupled to the inverting input terminal, providing the reference voltage.

7. A comparator for comparing a first input signal and a second input signal to obtain an output signal, comprising:
   a voltage generator, having an output terminal for providing a reference voltage according to a constant current and the second input signal;
   a buffer unit, providing the output signal according to the first input signal and a bias signal; and
   a threshold control loop, providing the bias signal to the buffer unit according to the second input signal, so as to regulate a transition threshold of the buffer unit close to the second input signal,
   wherein the buffer unit and the threshold control loop are powered by the reference voltage.

8. The comparator as claimed in claim 7, wherein the buffer unit comprises:
   a first PMOS transistor coupled between the output terminal of the voltage generator and a first node, having a gate for receiving the first input signal;
   a first NMOS transistor coupled to a ground, having a gate for receiving the bias signal;
   a second NMOS transistor coupled between the first NMOS transistor and the first node, having a gate for receiving the first input signal;
   a second PMOS transistor coupled between the output terminal of the voltage generator and a second node, having a gate coupled to the first node;
   a third NMOS transistor coupled to the ground, having a gate for receiving the bias signal; and a fourth NMOS transistor coupled between the third NMOS transistor and the second node, having a gate for receiving the first input signal.

9. The comparator as claimed in claim 7, further comprising:
a first inverter coupled to the second node of the buffer unit; and
a second inverter coupled to the first inverter, outputting the output signal,
wherein the first and second inverters are powered by the reference voltage.

10. The comparator as claimed in claim 7, wherein the threshold control loop comprises:
a third PMOS transistor coupled between the output terminal of the voltage generator and a third node, having a gate for receiving the second input signal;
a fifth NMOS transistor coupled to a ground, having a gate coupled to the third node; and
a sixth NMOS transistor coupled between the third node and the fifth NMOS transistor, having a gate for receiving the second input signal,
wherein the bias signal is a signal of the third node.

11. The comparator as claimed in claim 7, wherein the voltage generator comprises:
a current source, providing the constant current; and
an inverter coupled to the current source, having a gate receiving the second input signal; where the inverter is biased with the constant current to generate the reference voltage.

12. The comparator as claimed in claim 7, wherein the voltage generator comprises:
a current source, providing the constant current;
a fourth PMOS transistor coupled to the current source, having a gate for receiving the second input signal;
a seventh NMOS transistor coupled to a ground, having a gate for receiving the second input signal;
an eighth NMOS transistor coupled between the fourth PMOS transistor and the seventh NMOS transistor, having a gate for receiving the second input signal; and
an amplifier, having a non-inverting input terminal coupled to the current source and the fourth PMOS transistor, an inverting input terminal and an output terminal coupled to the inverting input terminal, providing the reference voltage.

* * * * *